(12) United States Patent
Minobe

(10) Patent No.: US 10,228,649 B2
(45) Date of Patent: Mar. 12, 2019

(54) POWER SUPPLY APPARATUS, IMAGE FORMING APPARATUS, AND INTEGRATED CIRCUIT

(71) Applicant: CANON KABUSHIKI KAISHA, Tokyo (JP)

(72) Inventor: Taro Minobe, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/466,312

(22) Filed: Mar. 22, 2017

(65) Prior Publication Data
US 2017/0194876 A1    Jul. 6, 2017

Related U.S. Application Data

(63) Continuation of application No. 13/951,746, filed on Jul. 26, 2013.

(30) Foreign Application Priority Data

Aug. 1, 2012  (JP) .................................. 2012-171146
Jun. 17, 2013 (JP) .................................. 2013-126546

(51) Int. Cl.
| | |
|---|---|
| *G03G 15/00* | (2006.01) |
| *H02M 3/335* | (2006.01) |
| *H01L 41/107* | (2006.01) |
| *H02M 7/217* | (2006.01) |

(52) U.S. Cl.
CPC ........... *G03G 15/80* (2013.01); *H01L 41/107* (2013.01); *H02M 3/33507* (2013.01); *H02M 7/217* (2013.01)

(58) Field of Classification Search
CPC ...................................................... G03G 15/80
See application file for complete search history.

(56) References Cited

U.S. PATENT DOCUMENTS

| | | | |
|---|---|---|---|
| 7,973,520 B2 | 7/2011 | Kondo | |
| 8,040,018 B2 | 10/2011 | Kondo | |
| 8,265,511 B2 | 9/2012 | Kosaka | |
| 8,350,550 B2 | 1/2013 | Kosaka | |
| 2009/0045697 A1 | 2/2009 | Kondo | |

(Continued)

FOREIGN PATENT DOCUMENTS

| | | |
|---|---|---|
| JP | 2007-189880 | 7/2007 |
| JP | 2007-336752 | 12/2007 |

(Continued)

OTHER PUBLICATIONS

Machine translation of JP2007-336752.*

(Continued)

*Primary Examiner* — David M. Gray
*Assistant Examiner* — Andrew V Do
(74) *Attorney, Agent, or Firm* — Venable, LLP

(57) ABSTRACT

The power supply apparatus is configured to detect the output voltage of a piezoelectric transformer and controls the frequency of a pulse signal to drive the piezoelectric transformer based on the detected output voltage and a preset target voltage so as to perform feedback control of the output voltage of the piezoelectric transformer, the gain when performing the feedback control is switched in accordance with the target voltage.

11 Claims, 7 Drawing Sheets

(56) References Cited

U.S. PATENT DOCUMENTS

| | | |
|---|---|---|
| 2010/0302809 A1 | 12/2010 | Kosaka |
| 2011/0097100 A1 | 4/2011 | Nagasaki |
| 2011/0188878 A1 | 8/2011 | Watanabe |
| 2011/0293311 A1 | 12/2011 | Nemoto |

FOREIGN PATENT DOCUMENTS

| | | |
|---|---|---|
| JP | 2008-224778 | 9/2008 |
| JP | 2009-038892 | 2/2009 |
| JP | 2009-038892 A | 2/2009 |
| JP | 2009-128416 | 6/2009 |
| JP | 2010-057255 | 3/2010 |
| JP | 2010-124601 | 6/2010 |
| JP | 2011-041445 | 2/2011 |
| JP | 2011-120455 | 6/2011 |
| JP | 2011-120455 A | 6/2011 |
| JP | 2011-166856 A | 8/2011 |
| JP | 2011-250549 | 12/2011 |
| KR | 2009-0013654 | 2/2009 |

OTHER PUBLICATIONS

Korean Office Action dated Jan. 26, 2016 during prosecution of related Korean Application No. 10-2013-0090774.

European Search Report dated Jun. 12, 2017 during prosecution of related European application No. 13178638.6.

Japanese Office Action dated Jul. 4, 2017 during prosecution of related Japanese application No. 2013-126546.

Korean Office Action dated Nov. 28, 2017 issued in Korean Application No. 10-2017-0013824. (Whole English-language translation included.).

Japanese Office Action dated Mar. 6, 2018 in Japanese Application No. 2013126546.

European Office Action dated Oct. 29, 2018 during prosecution of related European application No. 13178638.6.

Korean Office Action dated Dec. 18, 2018 during prosecution of related Korean application No. 10-2013-0090774 with English Translation.

\* cited by examiner

| SETTING VOLTAGE VALUE Tgt[V] | CONTROL GAIN PARAMETER GROUP |
|---|---|
| Tgt < 1000 | G1 |
| 1000 ≤ Tgt < 2000 | G2 |
| 2000 ≤ Tgt < 3000 | G3 |
| 3000 ≤ Tgt < 4000 | G4 |
| 4000 ≤ Tgt | G5 |

POWER SUPPLY APPARATUS, IMAGE FORMING APPARATUS, AND INTEGRATED CIRCUIT

This application is a continuation of application Ser. No. 13/951,746, filed Jul. 26, 2013, which claims priority to Japanese Application No. JP 2012-171146, filed Aug. 1, 2012 and Japanese Application No. JP 2013-126546, filed Jun. 17, 2013, the contents of each of which are incorporated by reference herein.

BACKGROUND OF THE INVENTION

Field of the Invention

The present invention relates to a power supply apparatus, an image forming apparatus, and an integrated circuit and, more particularly, to a high-voltage power supply using a piezoelectric transformer.

Description of the Related Art

Conventionally, an image forming apparatus using an electrophotographic method such as a copying machine, a printer, or a facsimile apparatus has been known. The image forming apparatus using the electrophotographic method includes a developing member that develops a latent image formed on an image bearing member using toner serving as a developing material, a charging member that uniformly charges the image bearing member, and a transfer member that transfers the toner image formed on the image bearing member to a recording material. A high voltage is applied to the developing member, the charging member, and the transfer member, thereby performing image formation. From the viewpoint of reducing the size and weight of a high-voltage power supply apparatus serving as a high-voltage power supply for outputting a high voltage to the plurality of members, there has been proposed generating a high voltage using a thin and lightweight high-power piezoelectric transformer (for example, Japanese Patent Application Laid-Open No. 2011-250549). A power supply apparatus using a piezoelectric transformer made of a ceramic can generate a high voltage at an efficiency higher than an electromagnetic transformer and also increase the distance between the electrode on the primary side and that on the secondary side. In addition, since special molding for insulation is unnecessary, the image forming apparatus can be made compact and lightweight.

FIG. 5A is a schematic view of a conventional high-voltage power supply apparatus using a piezoelectric transformer. Note that the same reference numerals as in a high-voltage power supply apparatus to be described later in the embodiments denote the same parts, and a detailed description thereof will be made in the embodiments. Since a piezoelectric transformer 101 generally has a characteristic with tails extending so that the output voltage is maximized at a resonance frequency F0, as shown in FIG. 5B, voltage control using a frequency is possible. The graph of FIG. 5B plots the driving frequency (Hz) of the piezoelectric transformer 101 along the abscissa and the output voltage (V) along the ordinate. Note that as the feature of the relationship between the frequency and the output voltage, the output voltage is maximized at the resonance frequency F0 and lowers as the frequency becomes higher or lower than the resonance frequency F0. In the high-voltage power supply apparatus described in Japanese Patent Application Laid-Open No. 2011-250549, a frequency generation block 2015 first outputs a pulse signal of a frequency Fmax much higher than the resonance frequency F0. After that, the frequency of the piezoelectric transformer 101 is changed between the frequency Fmax and the resonance frequency F0, thereby controlling the output voltage. That is, the output voltage of the piezoelectric transformer 101 can be increased by changing the frequency from the higher side to the lower side. Hence, a high voltage control unit 201 raises or lowers the frequency of the pulse signal of the frequency generation block 2015, thereby controlling the voltage of an output terminal Vout to the target voltage.

However, the conventional digital control circuit arrangement has the following problem because the frequency generation block 2015 uses a general digital counter circuit (for example, Japanese Patent Application Laid-Open No. 2009-038892). A control calculation block 2014 executes calculation using a predetermined formula based on a difference calculation result from a difference calculation block 2013, and outputs the preset value to the frequency generation block 2015 that is a digital counter circuit at the subsequent stage. The frequency generation block 2015 formed from the digital counter circuit generates a pulse signal in accordance with the input preset value. That is, the frequency generation block 2015 is configured to raise or lower the frequency of the pulse signal in accordance with the preset value. For this reason, when frequency control is performed for the piezoelectric transformer 101 that exhibits a nonlinear characteristic as shown in FIG. 5B as the relationship between the frequency and the output voltage, the relationship between the preset value and the output voltage is represented by a nonlinear characteristic as shown in FIG. 5C. More specifically, when the piezoelectric transformer 101 is controlled near the resonance frequency F0, the output voltage exhibits a steep characteristic with respect to the frequency. Hence, the output voltage exhibits a steep characteristic with respect to the preset value. On the other hand, when the piezoelectric transformer 101 is controlled at a frequency much higher than the resonance frequency F0, the output voltage exhibits a moderate characteristic with respect to the frequency. Hence, the output voltage exhibits a moderate characteristic with respect to the preset value. For these reasons, when the frequency generation block 2015 formed from a digital counter circuit performs frequency control of the piezoelectric transformer 101, the preset value (abscissa) and the output voltage (ordinate) have a nonlinear relationship, as shown in FIG. 5C.

If the high-voltage power supply apparatus using the piezoelectric transformer 101 is used to output a low voltage, the difference calculation result of the difference calculation block 2013 becomes small, and the amount of increase in the preset value of the control calculation block 2014 also becomes small. Hence, the preset value is increased many times until the target voltage, resulting in a long rise time. To solve this problem, the rise time can be shortened by switching the control gain in accordance with the voltage of the output terminal Vout, like a high-voltage power supply apparatus described in, for example, Japanese Patent Application Laid-Open No. 2007-189880. However, the system of an engine controller 501 becomes complex with this technique. More specifically, in the high voltage control unit 201, the number of operations of sequentially storing the voltage of the output terminal Vout in an output voltage register 2022 of a memory unit 2011 and transmitting the information of the output voltage register 2022 to a CPU 301 increases. In the CPU 301, the number of operations of determining the control gain based on the sequentially transmitted information of the output voltage register 2022 and storing the gain in the memory unit 2011 increases. For this reason, the system for controlling the high-voltage power supply apparatus becomes complex, resulting in, for example, increases in the development cost and the cost of the engine controller 501. Additionally, in, for example, the high-voltage power supply apparatus described in Japanese Patent Application Laid-Open No. 2007-189880, if the output of the piezoelectric transformer 101 changes due to an instantaneous load variation or the like during the image forming operation, and the control gain switches, it may be impossible to obtain a stable output voltage. This may lead to a degradation in quality of a formed image.

Such speeding up of the image forming operation and the influence on image quality sufficiently meet the requirements for the performance of the conventional image forming apparatus. However, recent image forming apparatuses particularly need to attain high quality and speeding up. There is also a demand for quickly outputting the target voltage even when the target voltage is low in the high-voltage power supply apparatus employing the piezoelectric transformer. To cope with this, it is necessary to stabilize the output voltage and quickly output the target voltage when controlling the voltage in a wide range.

SUMMARY OF THE INVENTION

In order to solve the above-described problem, the present invention enables to stably obtain the output of a power supply apparatus and shorten the rise time until the target voltage in a power supply apparatus using a piezoelectric transformer.

(1) The present invention provides a power supply apparatus including a piezoelectric transformer, a signal generation unit configured to generate a signal to drive the piezoelectric transformer, a detection unit configured to detect an output voltage of the piezoelectric transformer, and a frequency determination unit configured to determine a frequency of the signal from the signal generation unit by a feed back control based on a feedback signal corresponding to the output voltage detected by the detection unit and a target voltage signal corresponding to a target voltage, wherein the frequency determination unit determines the frequency of the signal based on a gain of the feedback signal switched in correspondence with the target voltage signal.

(2) The present invention also provides an image forming apparatus comprising an image forming unit, and a power supply configured to supply a high voltage to the image forming unit, wherein the power supply includes a piezoelectric transformer, a signal generation unit configured to generate a signal to drive the piezoelectric transformer, a detection unit configured to detect an output voltage of the piezoelectric transformer, and a frequency determination unit configured to determine a frequency of the signal from the signal generation unit by a feed back control based on a feedback signal corresponding to the output voltage detected by the detection unit and a target voltage signal corresponding to a target voltage, wherein the frequency determination unit determines the frequency of the signal based on a gain of the feedback signal switched in correspondence with the target voltage signal.

(3) The present invention also provides an integrated circuit for controlling an operation of a power supply apparatus including a piezoelectric transformer, including a signal generation unit configured to generate a signal to drive the piezoelectric transformer, and a frequency determination unit configured to determine a frequency of the signal from the signal generation unit by a feed back control based on a feedback signal corresponding to an output voltage of the piezoelectric transformer and a target voltage signal corresponding to a target voltage, wherein the frequency determination unit determines the frequency of the signal based on a gain of the feedback signal switched in correspondence with the target voltage signal.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The arrangement and operation of the present invention will now be described. Note that the embodiments to be described below are not intended to limit the technical scope of the present invention, but are merely examples. The embodiments of the present invention will be described below in detail with reference to the accompanying drawings.

First Embodiment

Image Forming Apparatus

Figure 1A:
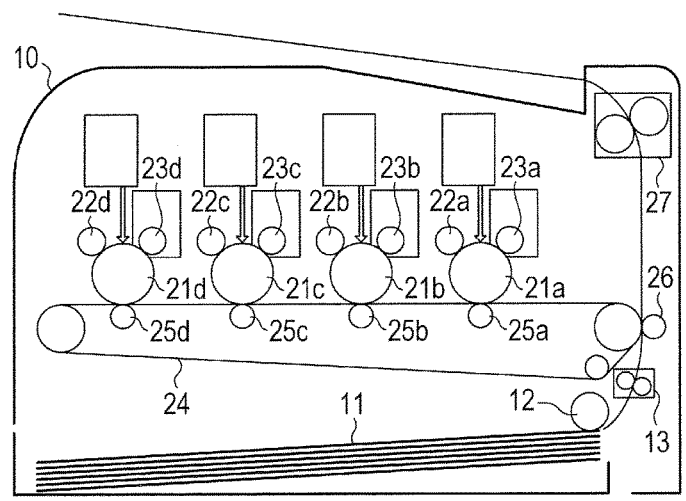
FIG. 1A is a view showing a section of an image forming apparatus according to the first and second embodiments.

An image forming apparatus according to the first embodiment will be described. In this embodiment, an example will be explained in which a high-voltage power supply apparatus is applied to a color laser printer serving as an image forming apparatus. FIG. 1A is a schematic sectional view of the color laser printer serving as the image forming apparatus according to this embodiment. A laser beam printer 10 includes a pickup roller 12 that picks up a recording sheet 11 (recording medium) stored in a tray (not shown), and sheet feeding rollers 13 that convey the recording sheet 11 picked up by the pickup roller 12. A secondary transfer unit 26 and an intermediate transfer belt 24 are provided downstream of the sheet feeding rollers 13 in the conveyance direction of the recording sheet 11. The secondary transfer unit 26 transfers a toner image (developing material image) transferred to the intermediate transfer belt 24 to the recording sheet 11 fed by the sheet feeding rollers 13 so as to form a color image. The toner image is formed by an image forming unit.

The image forming unit includes photosensitive drums 21a to 21d each serving as an image bearing member on which an electrostatic latent image is formed, and charging units 22a to 22d that uniformly charge the photosensitive drums 21a to 21d, respectively. The image forming unit also includes developing units 23a to 23d that develop the electrostatic latent images formed on the photosensitive drums 21a to 21d by toners, and primary transfer units 25a to 25d that transfer the toner images developed on the photosensitive drums 21a to 21d to the intermediate transfer belt 24. Note that suffixes a to d in the image forming unit represent, for example, yellow, magenta, cyan, and black, and will be omitted hereinafter except when necessary. A fixing unit 27 that incorporates a heater and a pressure roller to thermally fix the toner images transferred to the recording sheet 11 is provided downstream in the conveyance direction of the recording sheet 11. Note that the image forming apparatus including the power supply apparatus of this embodiment is not limited to the image forming apparatus having the above-described arrangement.

High-Voltage Power Supply Apparatus and Loads

Figure 1B:
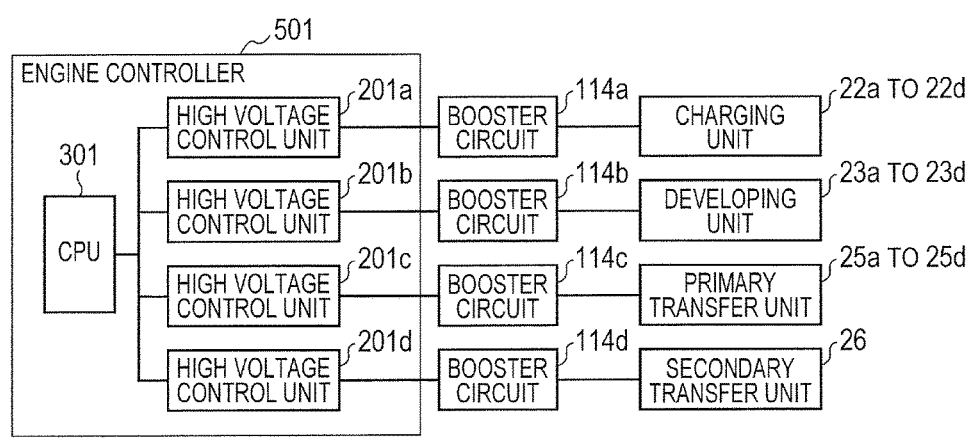
FIG. 1B is a block diagram showing the constituent blocks of the image forming apparatus indicating an application example of a high-voltage power supply apparatus according to the first and second embodiments.

FIG. 1B is a block diagram showing the constituent blocks of a plurality of high-voltage power supply apparatuses provided in the laser beam printer 10, and a charging unit 22, a developing unit 23, a primary transfer unit 25, and the secondary transfer unit 26 that are loads to which high voltages are applied. Note that the loads shown in FIG. 1B correspond to the image forming apparatus having the arrangement shown in FIG. 1A. When the power supply apparatus according to this embodiment is applied to an image forming apparatus having another arrangement, the voltages are applied to loads corresponding to the image forming apparatus.

An engine controller 501 includes a CPU 301, and high voltage control units 201a to 201d. To perform the respective processes of image formation, it is necessary to apply predetermined high voltages from the high-voltage power supply apparatus to the charging unit 22, the developing unit 23, the primary transfer unit 25, and the secondary transfer unit 26. The high voltage control unit 201a causes a voltage detection circuit 108a (see FIG. 2 to be described later, and the same shall apply hereinafter) to detect a high voltage applied to the charging unit 22, and controls a booster circuit 114a to make the detected voltage equal to a target voltage set by the CPU 301. The high voltage control unit 201b causes a voltage detection circuit 108b to detect a high voltage applied to the developing unit 23, and controls a booster circuit 114b to make the detected voltage equal to a target voltage set by the CPU 301. The high voltage control unit 201c causes a voltage detection circuit 108c to detect a high voltage applied to the primary transfer unit 25, and controls a booster circuit 114c to make the detected voltage equal to a target voltage set by the CPU 301. The high voltage control unit 201d causes a voltage detection circuit 108d to detect a high voltage applied to the secondary transfer unit 26, and controls a booster circuit 114d to make the detected voltage equal to a target voltage set by the CPU 301.

Arrangement of High-Voltage Power Supply Apparatus

Figure 2:
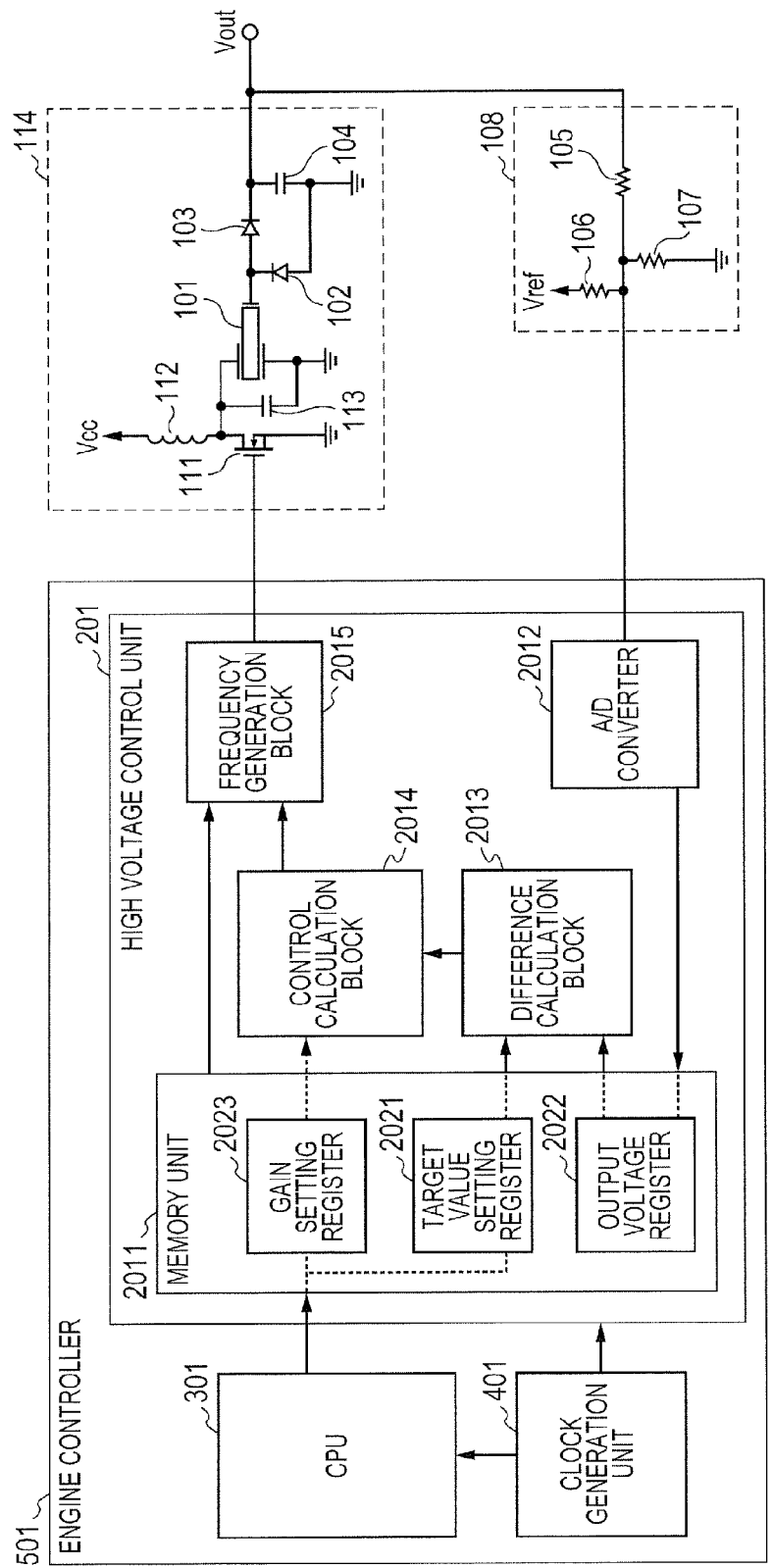
FIG. 2 is a block diagram showing the circuit arrangement of the high-voltage power supply apparatus according to the first embodiment.

The arrangement of the high-voltage power supply apparatus according to this embodiment will be described in detail. As a characteristic feature of this embodiment, in the high-voltage power supply apparatus using a piezoelectric transformer 101, the control gain is switched in accordance with the target voltage. FIG. 2 is a block diagram showing the high-voltage power supply apparatus according to this embodiment. The high-voltage power supply apparatus includes a booster circuit 114, a voltage detection circuit 108 (detection means), and the engine controller 501. The booster circuit 114 corresponds to the booster circuits 114a to 114d described with reference to FIG. 1B, and the voltage detection circuit 108 corresponds to the voltage detection circuits 108a to 108d also described with reference to FIG. 1B. The booster circuit 114 includes the piezoelectric transformer 101, rectifier diodes 102 and 103, a rectifier capacitor 104, a field effect transistor 111, a voltage resonance inductor 112, and a voltage resonance capacitor 113. The field effect transistor 111 performs a switching operation based on a pulse signal supplied from a high voltage control unit 201 to be described later. An LC resonance circuit formed from the inductor 112 and the capacitor 113 amplifies the pulse signal. The piezoelectric transformer 101 vibrates in accordance with the pulse signal supplied to its primary-side terminal, and generates, at its secondary-side terminal, an AC voltage amplified at a boost ratio corresponding to the size of the piezoelectric transformer 101.

A rectifying circuit is connected to the subsequent stage of the piezoelectric transformer 101. That is, the secondary-side terminal of the piezoelectric transformer 101 is connected to the cathode terminal of the diode 102 and the anode terminal of the diode 103. One terminal of the capacitor 104 is connected to the cathode terminal of the diode 103 and also to an output terminal Vout. The other terminal of the capacitor 104 is connected to the anode terminal of the diode 102 and also grounded. The diodes 102 and 103 and the capacitor 104 form a rectifying circuit. Hence, the AC voltage output from the secondary-side terminal of the piezoelectric transformer 101 is rectified and smoothed to a positive voltage by the rectifying circuit and supplied from the output terminal Vout to the load (not shown).

The voltage detection circuit 108 includes resistors 105, 106, and 107. The voltage of the output terminal Vout is divided by the voltage detection circuit 108, and the divided voltage is input to an A/D converter 2012 of the high voltage control unit 201 to be described later.

The engine controller 501 includes the high voltage control unit 201 (control means), the CPU 301, and a clock generation unit 401. The high voltage control unit 201 corresponds to the high voltage control units 201a to 201d described with reference to FIG. 1B, and performs constant voltage control of the voltage of the output terminal Vout. The CPU 301 sets the target voltage in the high voltage control unit 201. The clock generation unit 401 supplies a clock to the high voltage control unit 201 and the CPU 301.

Control Operation of High-Voltage Power Supply Apparatus

Figure 5A:
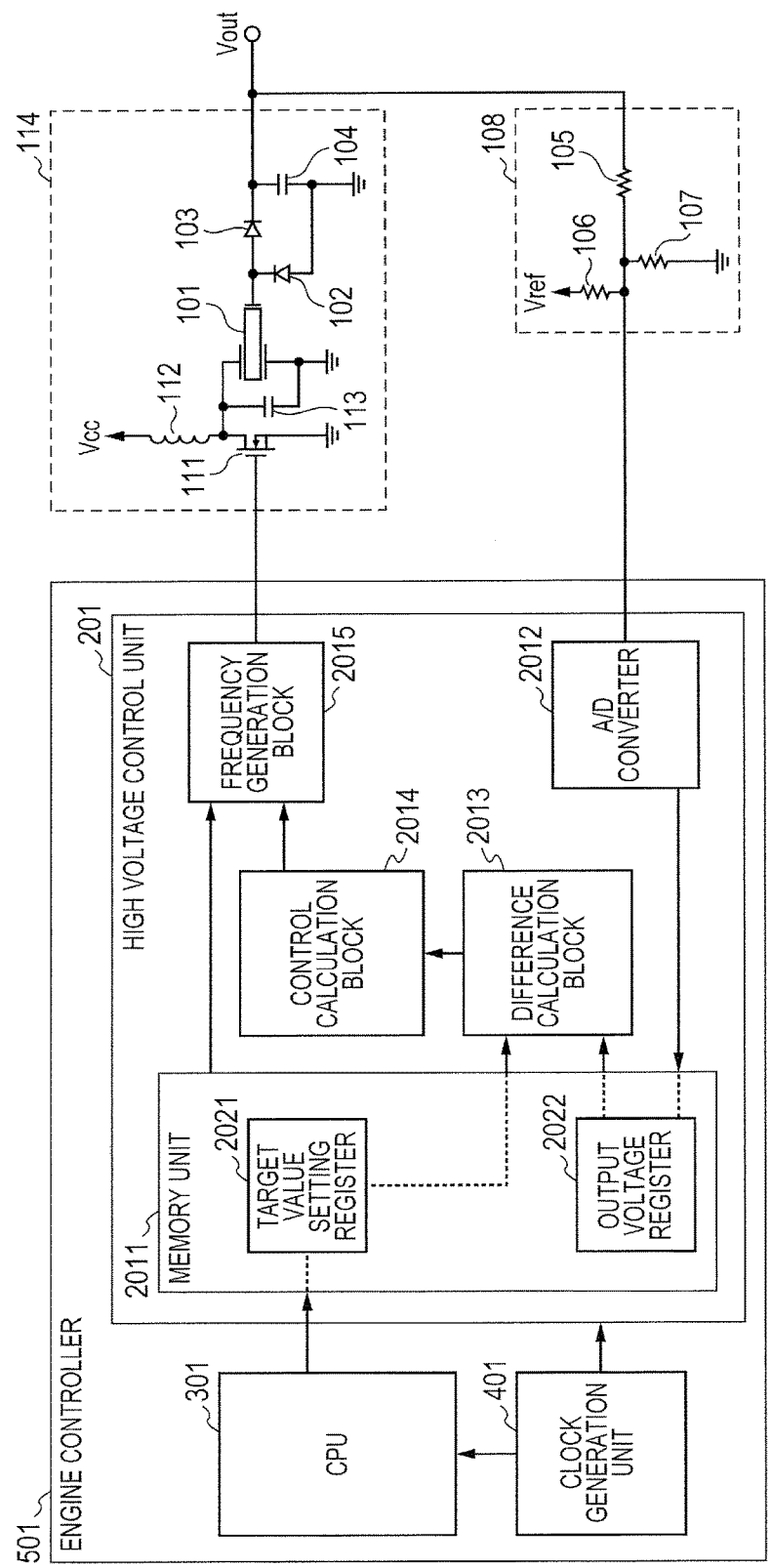
FIG. 5A is a block diagram showing the circuit arrangement of a conventional high-voltage power supply apparatus.

The control operation of the high-voltage power supply apparatus shown in FIG. 2 will be described next. The high voltage control unit 201 includes a memory unit 2011 (memory means) that is a volatile memory, the A/D converter 2012, a difference calculation block 2013, a control calculation block 2014, and a frequency generation block 2015 using a digital counter circuit. The memory unit 2011 includes a target value setting block 2021, an output voltage register 2022, and a gain setting register 2023. The high-voltage power supply apparatus according to this embodiment is different from the conventional high-voltage power supply apparatus shown in FIG. 5A in that the memory unit 2011 includes the gain setting register 2023.

The output of the output terminal Vout input to the A/D converter 2012 is digitally converted and stored in the output voltage register 2022 of the memory unit 2011. The target voltage is stored from the CPU 301 in the target value setting block 2021 and the gain setting register 2023 of the memory unit 2011. The difference calculation block 2013 calculates the difference between the values stored in the output voltage register 2022 and the target value setting block 2021, and outputs it to the control calculation block 2014.

The control calculation block 2014 performs proportional-integral-derivative (PID) control based on the difference calculation result of the difference calculation block 2013, calculates a preset value that is a value to determine the frequency of the pulse signal to be generated by the frequency generation block 2015, and outputs the preset value to the frequency generation block 2015. When the preset value for frequency control input from the control calculation block 2014 becomes small, the frequency generation block 2015 raises the frequency of the pulse signal. On the other hand, when the preset value for frequency control input from the control calculation block 2014 becomes large, the frequency generation block 2015 lowers the frequency of the pulse signal.

Frequency Generator Block

Figures 3A, 3B:
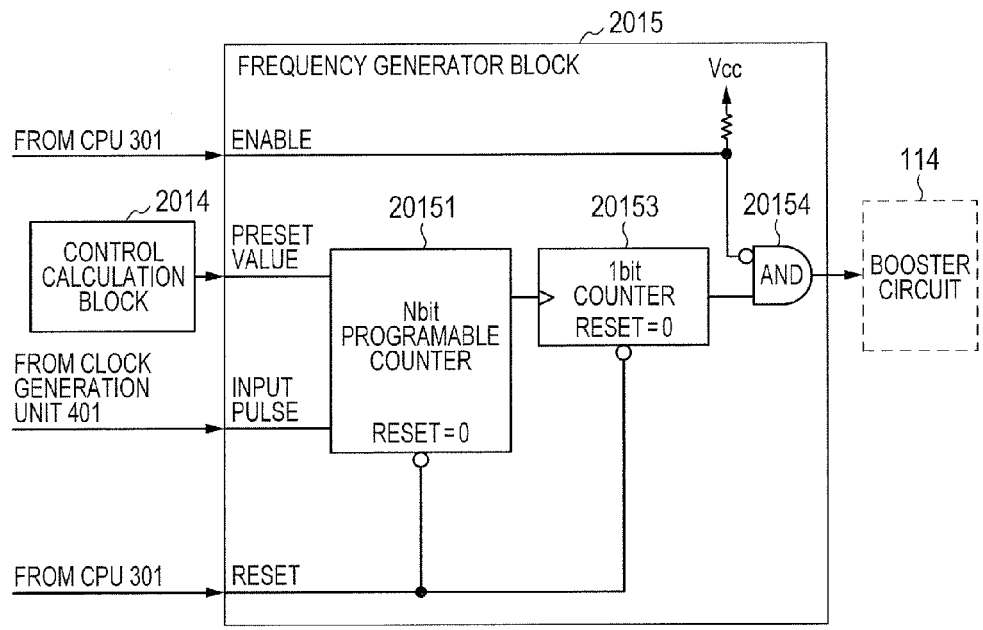
FIG. 3A is a block diagram showing the arrangement of a frequency generator block according to the first embodiment.
FIG. 3B is a view showing a table used to set a control gain parameter group.

The arrangement and operation of the frequency generation block 2015 will be described next in detail with reference to FIG. 3A. The frequency generation block 2015 includes an N-bit programmable counter 20151, a 1-bit counter 20153, and an AND gate 20154.

The clock generation unit 401 supplies an input pulse (for example, a clock of several MHz) to the N-bit programmable counter 20151 (to be referred to as the N-bit counter 20151 hereinafter). The N-bit counter 20151 increments the count value by one every time the input pulse goes high (to be referred to as H hereinafter), thereby performing count. In addition, when the above-described count value matches the preset value input from the control calculation block 2014, the output of the N-bit counter 20151 is inverted, and the above-described count value is cleared to zero (0). The output of the N-bit counter 20151 is output to the 1-bit counter 20153 to be described later. Note that when a low-level (to be referred to as L hereinafter) signal serving as a reset signal is input to a reset terminal RESET, the N-bit counter 20151 is reset, and the count value becomes zero (0). The reset signal to be input to the N-bit counter 20151 is supplied from the CPU 301.

The 1-bit counter 20153 inverts the output voltage every time the output signal from the N-bit counter 20151 changes to the H signal; it generates a pulse signal of a frequency corresponding to the information of the preset value input via the N-bit counter 20151. Note that the 1-bit counter 20153 is reset when a reset signal is input to the reset terminal RESET. The reset signal to be input to the 1-bit counter 20153 is supplied from the CPU 301.

When the preset value input from the control calculation block 2014 becomes small, the inversion period of the signal output from the N-bit counter 20151 shortens. Hence, the frequency of the pulse signal output from the frequency generation block 2015 rises. On the other hand, when the preset value input from the control calculation block 2014 becomes large, the inversion period of the signal output from the N-bit counter 20151 lengthens. Hence, the frequency of the pulse signal output from the frequency generation block 2015 lowers.

The AND gate 20154 on/off-controls the output of the high-voltage power supply apparatus in accordance with an ENABLE signal output from the CPU 301. More specifically, when the ENABLE signal is an L output, the AND gate 20154 outputs a pulse signal corresponding to the output of the 1-bit counter 20153. On the other hand, when the ENABLE signal is an H output, the output of the AND gate 20154 is forcibly changed to an L signal, and the AND gate 20154 outputs the L signal. Hence, since the pulse signal output from the high voltage control unit 201 can be on/off-controlled in accordance with the ENABLE signal output from the CPU 301, the output of the high-voltage power supply apparatus can be on/off-controlled.

Figure 5B:
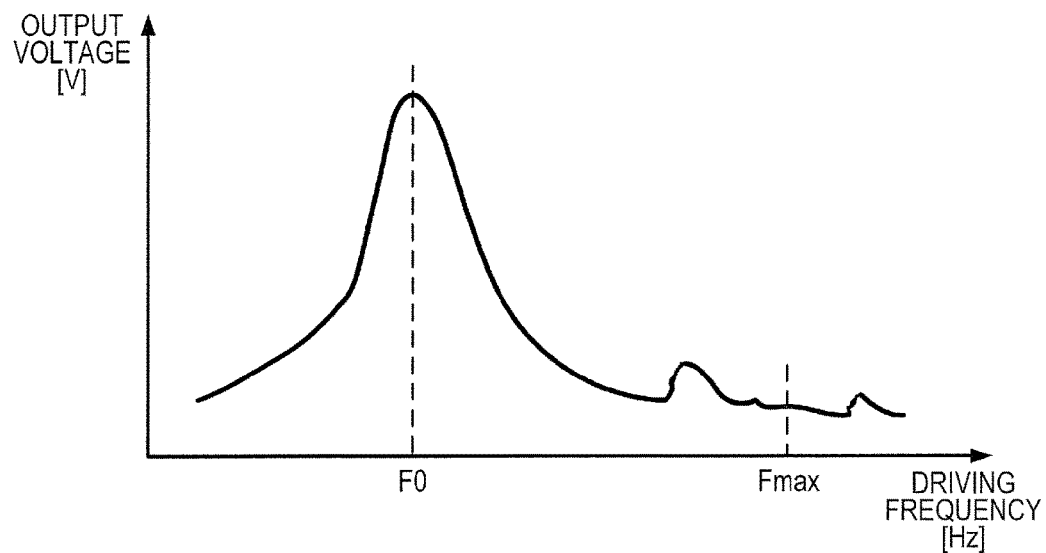
FIG. 5B is a graph showing the driving frequency vs. output voltage characteristic of a piezoelectric transformer.

Note that when changing the frequency of the piezoelectric transformer 101 between a frequency Fmax and a resonance frequency F0 shown in FIG. 5B described above, the limit values Fmax and F0 are provided for the preset value of the control calculation block 2014. That is, when the preset value has reached the limit value Fmax or F0, the calculation operation of PID control of the control calculation block 2014 is stopped (the calculation result is held). At this time, the limit values Fmax and F0 can be stored in the memory unit 2011, set by the CPU 301, or fixed.

Control Gain Switching Operation

An operation of switching the control gain in accordance with the setting voltage value (target voltage value) in the high-voltage power supply apparatus according to this embodiment will be described. FIG. 3B is a view showing a table 800 used to set the control gain in accordance with the setting voltage value according to this embodiment. The table 800 is an example of a lookup table that defines the correspondence between the setting voltage value (Tgt[V]) of the high-voltage power supply apparatus and the control gain parameter group (to be also referred to as a gain or control gain hereinafter) of the control calculation block 2014. The table 800 that associates the high-voltage power supply apparatus and the gain is stored in advance in the ROM included in the CPU 301. Note that the control gain parameter group in the table 800 includes the parameters of the gains of the proportional (P term), integral (I term), and derivative (D term) of PID control as an example of feedback control. That is, the control gain parameter group includes the set values of control parameters for performing PID control, which are optimized for each setting voltage value in view of elements of the time delay in the high-voltage power supply circuit and the A/D converter 2012 of the high voltage control unit 201. The table 800 may define a relation defining the correspondence between the setting voltage value of the high-voltage power supply apparatus and the control gain parameter group of the control calculation block 2014.

(When Setting Voltage Value is Low)

Figure 5C:
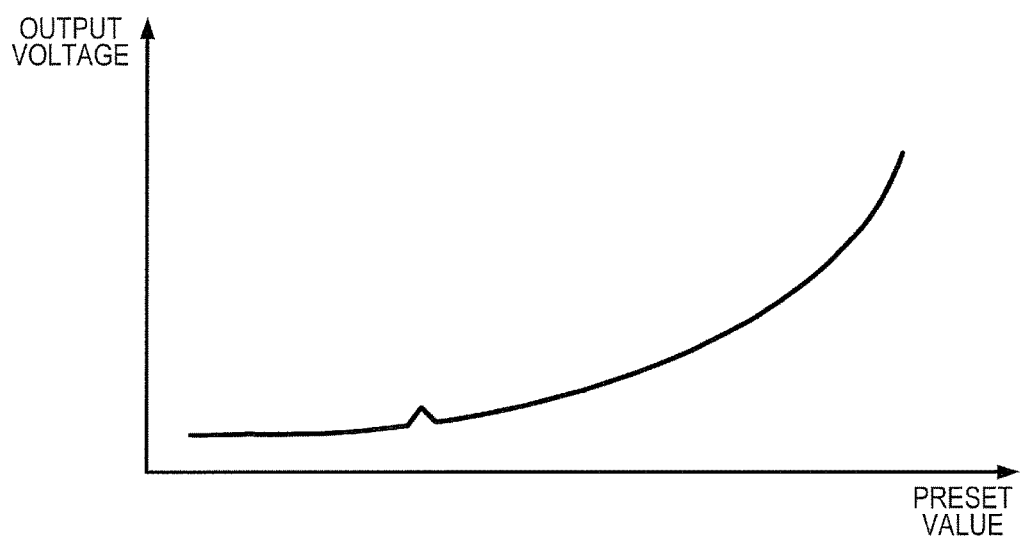
FIG. 5C is a graph showing the relationship between a preset value and the output voltage.

When frequency control of the piezoelectric transformer 101 is performed to obtain a low voltage, the frequency generation block 2015 drives the piezoelectric transformer 101 in a region where the output voltage with respect to the frequency is moderate (see FIG. 5B). Hence, the output voltage exhibits a moderate characteristic (see FIG. 5C) with respect to the preset value of the control calculation block 2014. In this embodiment, the CPU 301 increases the gain of PID control of the control calculation block 2014 and largely changes the preset value of the control calculation block 2014, thereby largely changing the frequency of the pulse signal. That is, the CPU 301 sets the setting voltage value and the control gain parameter group (in FIG. 3B, a parameter group corresponding to G1) corresponding to the setting voltage value in each of the target value setting block 2021 and the gain setting register 2023 of the memory unit 2011.

G1 is a gain group optimized to obtain a low target voltage lower than, for example, 1,000 V (Tgt<1000). In this embodiment, it is set by the proportional (P term)=10, the integral (I term)=8 and the derivative (D term)=4. The PID control of the control calculation block 2014 can largely change the preset value of the control calculation block 2014 by changing the gains used in the proportional (P term), integral (I term), and derivative (D term). As a result, even when the piezoelectric transformer 101 is driven in the region where the output voltage is moderate with respect to the frequency, the preset value can largely be changed. It is therefore possible to quickly output the target voltage.

(When Setting Voltage Value is High)

Reversely, when frequency control of the piezoelectric transformer 101 is performed to obtain a high voltage, the frequency generation block 2015 drives the piezoelectric transformer 101 in a region where the output voltage is steep with respect to the frequency (see FIG. 5B). Hence, the output voltage exhibits a steep characteristic (see FIG. 5C) with respect to the preset value of the control calculation block 2014. In this embodiment, the CPU 301 changes the gain of PID control of the control calculation block 2014 and finely changes the preset value of the control calculation block 2014, thereby finely changing the frequency of the pulse signal. That is, the CPU 301 sets the setting voltage value and the control gain parameter group (in FIG. 3B, a parameter group corresponding to G5) corresponding to the setting voltage value in each of the target value setting block 2021 and the gain setting register 2023 of the memory unit 2011.

G5 is a gain group optimized to obtain a high target voltage equal to or higher than, for example, 4,000 V (4000≤Tgt). In this embodiment, it is set by the proportional (P term)=6, the integral (I term)=4 and the derivative (D term)=4. The PID control of the control calculation block 2014 can change the preset value of the control calculation block 2014 to be finer than terms in G1 by changing the gains used in the proportional (P term), integral (I term), and derivative (D term). As a result, even when the piezoelectric transformer 101 is driven in the region where the output voltage is steep with respect to the frequency, calculation can be done using the conventional PID control gain. This makes it possible to output the target voltage in a time equal to the conventional rise time and also output a stable voltage without overshoot.

As described above, according to the arrangement of this embodiment, the gain of PID control is switched in accordance with the setting voltage value. This allows the high-voltage power supply apparatus using the piezoelectric transformer to quickly output the target voltage even when outputting a low voltage.

Other Embodiments

Figure 4A:
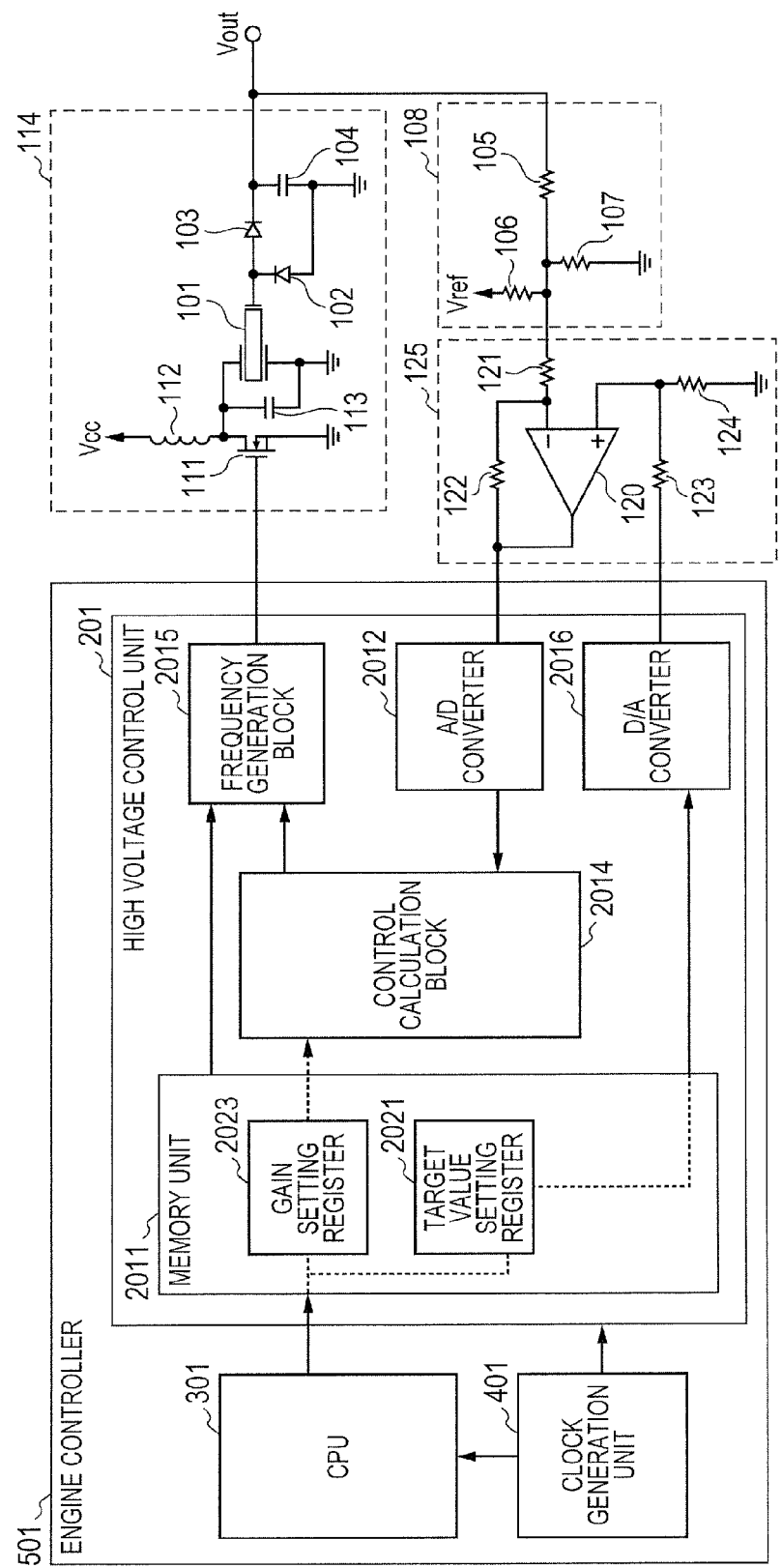
FIG. 4A is a block diagram showing a modification of the circuit arrangement of the high-voltage power supply apparatus according to the first embodiment.

Note that in the above-described explanation, the voltage of the output terminal Vout is divided by the voltage detection circuit 108, and the divided voltage is input to the A/D converter 2012 of the high voltage control unit 201. However, the embodiment is not limited to the above-described case. For example, the difference calculation block 2013 may be formed as an analog circuit, as indicated by 125 in FIG. 4A. That is, reference numeral 125 denotes a differential amplification circuit including an operational amplifier 120 and resistors 121, 122, 123, and 124, which will be referred to as the differential amplification circuit 125 (output means) hereinafter. The voltage of the output terminal Vout is divided by the voltage detection circuit 108, and the divided voltage is input to the inverting input terminal (−terminal) of the operational amplifier 120 via the resistor 121.

On the other hand, the setting voltage value (target voltage value) set in the target value setting block 2021 by the CPU 301 is output to a D/A converter 2016. The setting voltage value output from the D/A converter 2016 is input to the noninverting input terminal (+terminal) of the operational amplifier 120 via the resistor 123. The operational amplifier 120 outputs the signal such that the inverting input terminal and the noninverting input terminal form a virtual short. The output of the operational amplifier 120 is input to the control calculation block 2014 via the A/D converter 2012. Hence, the differential amplification circuit 125 can output the difference between the setting voltage value and the voltage of the output terminal Vout, like the difference calculation block 2013. The control calculation block 2014 outputs the preset value based on a value obtained by causing the A/D converter 2012 to digitally convert the difference output from the differential amplification circuit 125. Note that the same reference numerals as in FIG. 2 denote the same parts in FIG. 4A, and a description thereof will be omitted.

As described above, according to this embodiment, it is possible to stably obtain the output of the power supply apparatus and shorten the rise time until the target voltage in the power supply apparatus using the piezoelectric transformer.

Second Embodiment

High-Voltage Power Supply Apparatus

The arrangement and operation according to the second embodiment will be described in detail with reference to FIG. 4B. In the first embodiment, the table 800 is stored in advance in the ROM included in the CPU 301, and the CPU 301 sets the control gain parameter group in the gain setting register 2023 of the memory unit 2011. The second embodiment is different in that a table 800 (see FIG. 3B), which is stored in the CPU 301 in the first embodiment, is stored in a memory unit 2011 of a high voltage control unit 201. In this embodiment, a description of the same parts as in the first embodiment will be omitted, and the arrangement that stores the table 800 in the memory unit 2011 of the high voltage control unit 201 and its operation will be described in detail.

Figure 4B:
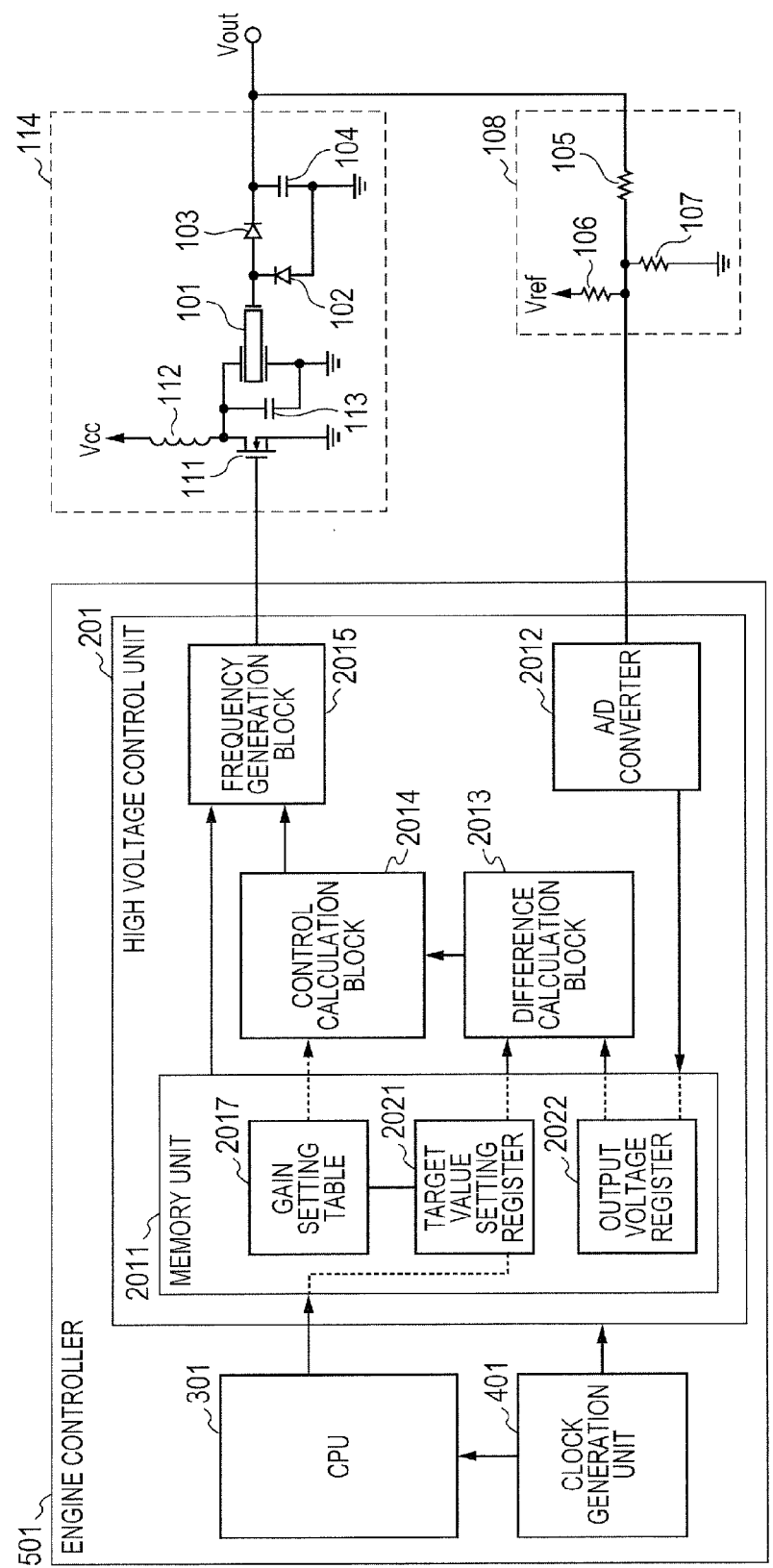
FIG. 4B is a block diagram showing the circuit arrangement of the high-voltage power supply apparatus according to the second embodiment.

FIG. 4B is a block diagram showing a high-voltage power supply apparatus according to this embodiment. A gain setting table 2017 stores the table 800 of the first embodiment. The gain setting table 2017 is an example of a lookup table that defines the correspondence between the setting voltage value (target voltage value) and the PID control gain parameters of a control calculation block 2014. Note that the PID control gain parameter group in the table 800 is optimized for each setting voltage value, as in the first embodiment. The table 800 may define a relation defining the correspondence between the setting voltage value of the high-voltage power supply apparatus and the control gain parameter group of the control calculation block 2014, as in the first embodiment.

The control calculation block 2014 can perform PID control calculation using the control gain parameter group corresponding to the setting voltage value from the gain setting table 2017. Hence, as in the first embodiment, switching the control gain in accordance with the setting voltage value makes it possible to stably obtain the output of the high-voltage power supply apparatus and quickly output the target voltage even when outputting a low voltage.

When the table 800 is stored in the memory unit 2011 of the high voltage control unit 201, as in this embodiment, the CPU 301 sets only the target voltage in the memory unit 2011 of the high voltage control unit 201. For this reason, the number of registers in the high voltage control unit 201 can be decreased. In addition, control can be done without intervening the CPU 301.

Note that in this embodiment as well, the difference calculation block 2013 may be changed to a differential amplification circuit 125 formed from an analog circuit, as in the first embodiment.

In the table 800 in the above-described first and second embodiments, although the values G1, G2, G3, G4, and G5 in the control gain parameter group of the table 800 satisfies the value relationship within the range satisfying G1>G2>G3>G4>G5, the present invention is not restricted by this relationship term. For example, the impedance variation of the member to which the high voltage power supply supplies a high voltage can be considered as the values G1, G2, G3, G4, and G5 in the table 800. That is, since the relationship between the frequency and the output voltage shown in FIG. 5B varies according to the impedance of the member, the output value of the high voltage power supply can be stably obtained by detecting the impedance of the member, considering the characteristic variation between the frequency and the output voltage and optimizing the values G1, G2, G3, G4, and G5 in the control gain parameter group in the table 800.

In the above-described first and second embodiments, PID control has been exemplified as the feedback control of the control calculation block 2014. However, feedback control of any other form is usable if the gain of the feedback control can be changed.

As described above, according to this embodiment, it is possible to stably obtain the output of the power supply apparatus and shorten the rise time until the target voltage in the power supply apparatus using the piezoelectric transformer.

Note that the high voltage control unit 201 described in the first and second embodiments may be formed as an integrated circuit. For example, the high voltage control unit 201 can be formed as, for example, an ASIC (Application Specific Integrated Circuit). The integrated circuit can reduce the circuit scale of the power supply apparatus, leading to size reduction of the circuit board of the power supply apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-171146, filed Aug. 1, 2012, and 2013-126546, filed Jun. 17, 2013 which are hereby incorporated by reference herein in their entirety.

What is claimed is:

1. A power supply apparatus comprising:
a piezoelectric transformer configured to output an output voltage;
a signal generator configured to generate a signal to drive the piezoelectric transformer; and
a controller configured to change a frequency of the signal so that the output voltage from the piezoelectric transformer is to be at a target voltage,
wherein in a case where the target voltage is a first voltage, the controller sets a change amount of the frequency of the signal to a first value, and changes the frequency of the signal per the first value in a period from a predetermined frequency to a target frequency corresponding to the first voltage, and in a case where the target voltage is a second voltage less than the first voltage, the controller sets a change amount of the frequency of the signal to a second value larger than the first value, and changes the frequency of the signal per the second value in a period from the predetermined frequency to a target frequency corresponding to the second voltage.

2. The power supply apparatus according to claim 1,
wherein the controller changes the frequency of the signal so that a value corresponding to the output voltage output from the piezoelectric transformer is to be a setting value of the output corresponding to the target voltage.

3. The power supply apparatus according to claim 1, further comprising a storage unit to store information to determine the first value and the second value.

4. The power supply apparatus according to claim 3, wherein the information includes gain values in a PID (proportional-integral-derivative) control, the gain values corresponding to the first value and the second value.

5. The power supply apparatus according to claim 1, wherein in a case where the frequency of the signal is changed from the predetermined frequency to the target frequency corresponding to the first voltage, when the piezoelectric transformer is driven according to the signal, the controller changes the frequency of the signal so that the frequency of the signal closes to a resonance frequency corresponding to a maximum value of the output voltage output from the piezoelectric transformer.

6. An image forming apparatus comprising:
an image forming unit; and
a power supply configured to supply a high voltage to the image forming unit;
wherein the power supply comprises:
a piezoelectric transformer configured to output an output voltage;
a signal generator configured to generate a signal to drive the piezoelectric transformer; and
a controller configured to change a frequency of the signal so that the output voltage from the piezoelectric transformer is to be at a target voltage,
wherein in a case where the target voltage is a first voltage, the controller sets a change amount of the frequency of the signal to a first value, and changes the frequency of the signal per the first value in a period from a predetermined frequency to a target frequency corresponding to the first voltage, and in a case where the target voltage is a second voltage less than the first voltage, the controller sets a change amount of the frequency of the signal to a second value larger than the first value, and changes the frequency of the signal per the second value in a period from the predetermined frequency to a target frequency corresponding to the second voltage.

7. The image forming apparatus according to claim 6, wherein the controller changes the frequency of the signal so that a value corresponding to the output voltage output from the piezoelectric transformer is to be a setting value corresponding to the target voltage.

8. The image forming apparatus according to claim 6, further comprising a storage unit to store information to determine the first value and the second value.

9. The image forming apparatus according to claim 8, wherein the information includes gain values in a PID (proportional-integral-derivative) control, the gain values corresponding to the first value and the second value.

10. The image forming apparatus according to claim 6, wherein in a case where the frequency of the signal is changed from the predetermined frequency to the target frequency corresponding to the first voltage, when the piezoelectric transformer is driven according to the signal, the controller changes the frequency of the signal so that the frequency of the signal closes to a resonance frequency corresponding to a maximum value of the output voltage output from the piezoelectric transformer.

11. The image forming apparatus according to claim 6, wherein the image forming unit includes a charging unit configured to charge an image bearing member, a developing unit configured to develop a latent image formed on the image bearing member, and a transfer unit configured to transfer an image formed on the image bearing member.

\* \* \* \* \*